US012635391B2

(12) United States Patent
Tian et al.

(10) Patent No.: US 12,635,391 B2
(45) Date of Patent: May 19, 2026

(54) TRANSPARENT DISPLAY PANEL AND DISPLAY APPARATUS

(71) Applicant: BOE Technology Group Co., Ltd., Beijing (CN)

(72) Inventors: Xueyan Tian, Beijing (CN); Jianchao Zhu, Beijing (CN); Guanqin Chen, Beijing (CN); Zhengdao Liu, Beijing (CN); Chong Zhang, Beijing (CN); Liangjian Li, Beijing (CN); Shiming Shi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 588 days.

(21) Appl. No.: 18/025,625

(22) PCT Filed: May 24, 2022

(86) PCT No.: PCT/CN2022/094729
§ 371 (c)(1),
(2) Date: Mar. 9, 2023

(87) PCT Pub. No.: WO2023/225856
PCT Pub. Date: Nov. 30, 2023

(65) Prior Publication Data
US 2024/0292716 A1 Aug. 29, 2024

(51) Int. Cl.
*H10K 59/80* (2023.01)
*H10K 59/179* (2023.01)

(52) U.S. Cl.
CPC ......... *H10K 59/875* (2023.02); *H10K 59/179* (2023.02)

(58) Field of Classification Search
CPC ................. H10K 59/179–1795; H10K 59/875
See application file for complete search history.

(56) References Cited

U.S. PATENT DOCUMENTS

2019/0064607 A1* 2/2019 Cheng ................. H10D 86/441
2021/0158004 A1 5/2021 Lian

FOREIGN PATENT DOCUMENTS

| CN | 104932161 A | 9/2015 |
|---|---|---|
| CN | 106249932 A | 12/2016 |
| CN | 107422547 A | 12/2017 |
| CN | 112701149 A | 4/2021 |
| CN | 113644220 A | 11/2021 |
| CN | 114628481 A | 6/2022 |
| JP | 2019160807 A | 9/2019 |

* cited by examiner

*Primary Examiner* — Daniel P Shook
(74) *Attorney, Agent, or Firm* — IPro, PLLC

(57) ABSTRACT

A transparent display panel (10) and a display apparatus are provided, including: a substrate (100); a signal transmission layer (110), located on the substrate (100), where the signal transmission layer (110) has a plurality of hollowed-out areas (LB); and a first electrode layer (130), located on the substrate (1000), where the first electrode layer (130) has a plurality of first electrodes (130) arranged at intervals; where an orthogonal projection of at least one of the plurality of first electrodes (130) on the substrate (100) and an orthogonal projection of at least one of the plurality of hollowed-out areas (LB) on the substrate (100) have an overlapping area.

18 Claims, 12 Drawing Sheets

10          PX

Driving circuit

20

110

WK

LB

120

121 —

TRANSPARENT DISPLAY PANEL AND DISPLAY APPARATUS

CROSS-REFERENCE TO RELATED APPLICATIONS

The disclosure is a National Stage of International Application No. PCT/CN2022/094729, filed on May 24, 2022, which is hereby incorporated by reference in their entireties.

FIELD

The present disclosure relates to the technical field of display, in particular to a transparent display panel and a display apparatus.

BACKGROUND

In display apparatuses such as organic light-emitting diodes (OLEDs) and quantum dot light-emitting diodes (QLEDs), a plurality of pixel units are generally included. Each pixel unit may include a plurality of sub-pixels of different colors. By controlling the brightness corresponding to each sub-pixel, the colors to be displayed are mixed to display color images.

SUMMARY

A transparent display panel provided by an embodiment of the present disclosure includes:
   a substrate;
   a signal transmission layer, located on the substrate, and having a plurality of hollowed-out areas; and
   a first electrode layer, located on the substrate, and having a plurality of first electrodes arranged at intervals;
   where an orthogonal projection of at least one of the plurality of first electrodes on the substrate and an orthogonal projection of at least one of the plurality of hollowed-out areas on the substrate have an overlapping area.
   In some examples, each first electrode includes an electrode switching part and an electrode main body part which are electrically connected with each other;
      an orthogonal projection of each of the hollowed-out areas on the substrate and an orthogonal projection of the electrode main body part of at least one of the first electrodes on the substrate have an overlapping area; and
      orthogonal projections of electrode switching parts on the substrate and an orthogonal projection of the signal transmission layer on the substrate have overlapping areas.
   In some examples, orthogonal projections of edges of the electrode main body parts on the substrate and the orthogonal projection of the signal transmission layer on the substrate have overlapping areas, and orthogonal projections of part of the electrode main body parts except the edges on the substrate are located in the orthogonal projections of the hollowed-out areas on the substrate.
   In some examples, the transparent display panel further includes an insulating layer located between the signal transmission layer and the first electrode layers; and
      an electrode switching part of the at least one of the plurality of first electrodes is electrically connected with the signal transmission layer through at least one electrode through-hole; where the at least one electrode through-hole penetrates through the insulating layer.

In some examples, electrode switching parts of part of the plurality of first electrodes are electrically connected with the signal transmission layer through the electrode through-holes, and electrode switching parts of the remaining first electrodes are in a floating state.
   In some examples, the electrode switching parts electrically connected with electrode main body parts of which orthogonal projections overlap orthogonal projections of part of the plurality of hollowed-out areas are electrically connected to the signal transmission layer through electrode through-holes, and the electrode switching parts electrically connected with electrode main body parts of which orthogonal projections overlap orthogonal projections of the remaining hollowed-out areas are in a floating state.
   In some examples, the insulating layer includes an interlayer insulating layer and a planarization layer; where the interlayer insulating layer is located between the signal transmission layer and the first electrode layer, and the planarization layer is located between the interlayer insulating layer and the first electrode layer;
      the same electrode through-hole includes a first electrode through-hole and a second electrode through-hole; where the first electrode through-hole penetrates through the interlayer insulating layer, and the second electrode through-hole penetrates through the planarization layer; and
      an orthogonal projection of the second electrode through-hole on the substrate covers an orthogonal projection of the first electrode through-hole on the substrate.
   In some examples, the electrode through-holes corresponding to the electrode main body parts of which orthogonal projections overlap the orthogonal projection of the same hollowed-out area are located in the same side of the hollowed-out area.
   In some examples, the electrode through-holes corresponding to the electrode main body parts covered by the orthogonal projections of at least part of hollowed-out areas are located at the same side of the at least part of hollowed-out areas.
   In some examples, the transparent display panel includes a plurality of pixel units, and at least one of the plurality of pixel units includes at least one sub-pixel; and
      the at least one sub-pixel includes at least one of the plurality of first electrodes.
   In some examples, electrode main body parts of which orthogonal projections overlap the orthogonal projection of the same hollow area are located in the same pixel unit; and
      electrode main body parts of which orthogonal projections overlap the orthogonal projections of different hollowed-out areas are located in different pixel units.
   In some examples, the plurality of pixel units are arranged in columns on the substrate.
   In some examples, each pixel unit includes a first sub-pixel, a second sub-pixel, and a third sub-pixel; and
      the size of the electrode main body part in the first sub-pixel is larger than the size of the electrode main body part in the second sub-pixel, and the size of the electrode main body part in the second sub-pixel is larger than the size of the electrode main body part in the third sub-pixel.
   In some examples, in the same pixel unit, the electrode main body part in the second sub-pixel and the electrode main body part in the third sub-pixel are arranged in a first direction and form a main body part group; and
      in the same pixel unit, the electrode main body part in the first sub-pixel and the main body part group are arranged in a second direction.

In some examples, each electrode switching part includes an electrode extension part and a through-hole connection part;

in the same first electrode, the electrode main body part is electrically connected with the through-hole connection part through the electrode extension part; and the through-hole connection parts of part of the first electrodes are electrically connected with the signal transmission layer through the electrode through-holes, and the through-hole connection parts of the rest of the first electrodes are in a floating state; and the through-hole connection parts of the first electrodes are located at the same side of the first electrodes.

In some examples, in the same pixel unit, the electrode extension part in the third sub-pixel is located between the electrode extension part in the first sub-pixel and the electrode extension part in the second sub-pixel.

In some examples, in the same pixel unit, the electrode main body part in the third sub-pixel is located on a side, facing away from the through-hole connection part in the second sub-pixel, of the electrode main body part in the second sub-pixel;

the electrode main body part in the second sub-pixel is located between the electrode main body part in the third sub-pixel and the through-hole connection part in the second sub-pixel; and in the same pixel unit, the electrode extension part in the third sub-pixel extends and is arranged in a gap between the electrode main body part in the first sub-pixel and the electrode main body part in the second sub-pixel.

In some examples, the transparent display panel further includes a pixel defining layer located at a side, facing away from the substrate, of the first electrode layer;

the pixel defining layer has openings; where the first electrodes are arranged corresponding to the openings; and orthogonal projections of the electrode main body parts of the first electrodes on the substrate cover orthogonal projections of the corresponding openings on the substrate.

In some examples, at least one mesh connection of the signal transmission layer has a perforative digging hole.

In some examples, the signal transmission layer is divided into a plurality of signal transmission parts which are insulated from each other, and each signal transmission part has the at least one hollowed-out area; and electrode switching parts corresponding to the at least part of the hollowed-out areas in the at least one signal transmission part are electrically connected with the signal transmission layer through the electrode through-holes.

A display apparatus provided by an embodiment of the present disclosure includes a driving circuit and the above transparent display panel;

where the driving circuit is electrically connected with the transparent display panel; and the driving circuit is configured to drive the transparent display panel to display patterns.

DETAILED DESCRIPTION OF THE EMBODIMENTS

Figure 1:
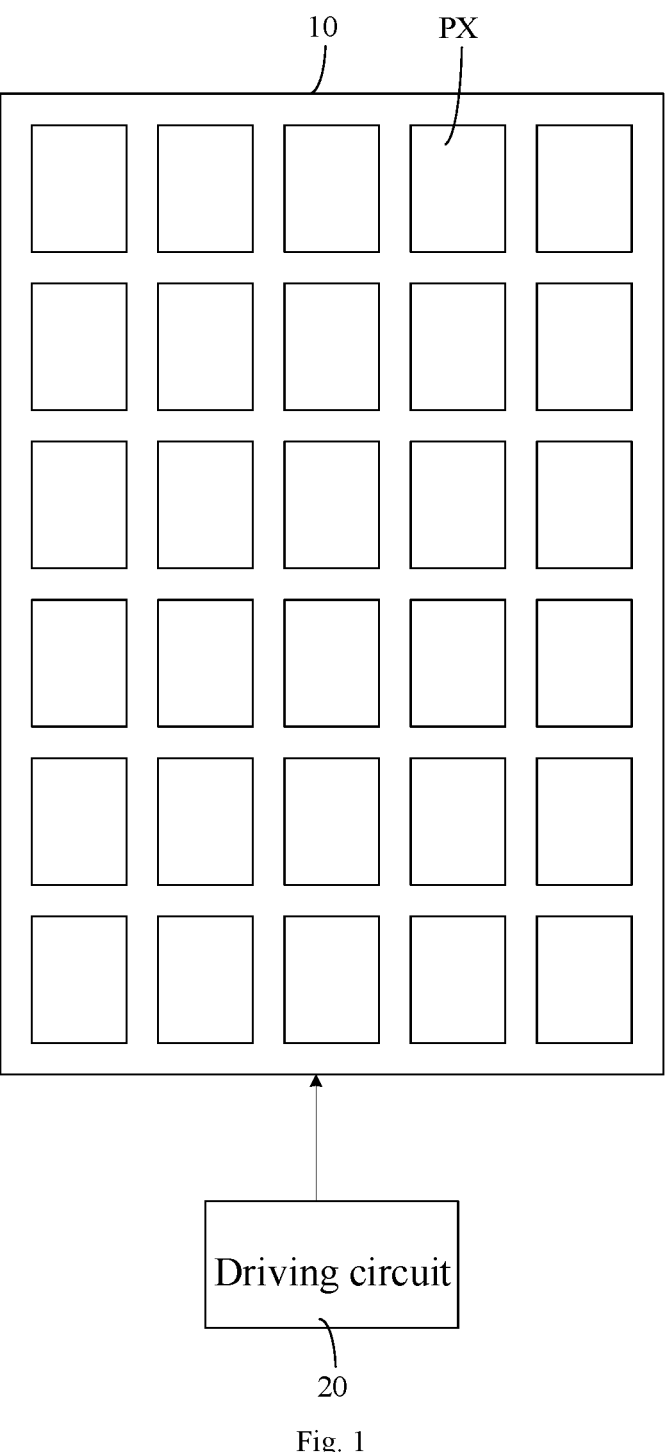
FIG. 1 is a schematic structural diagram of a display apparatus provided by an embodiment of the present disclosure.

In order to make the objectives, technical solutions and advantages of the embodiment of the disclosure clearer, the technical solutions of the embodiment of the disclosure will be described clearly and completely with the attached accompanying drawings. Obviously, the described embodiments are some, but not all, embodiments of the present disclosure. And the embodiments in the present disclosure and features in the embodiments can be combined with each other without conflict. Based on the described embodiments of the present disclosure, all other embodiments obtained by ordinary skills in the art without creative work shall fall within the protection scope of the present disclosure.

Unless otherwise defined, technical or scientific terms used in the present disclosure shall have their ordinary meanings as understood by those of ordinary skills in the art to which the present disclosure belongs. The terms "first". "second" and the like used in the present disclosure do not indicate any order, quantity or importance, but are only used to distinguish different components. Similar words such as "including" or "containing" mean that the elements or objects appearing before the word cover the elements or objects listed after the word and their equivalents, without excluding other elements or objects. Similar words such as "connect" or "link" are not limited to physical or mechanical connection, but can include electrical connection, whether direct or indirect.

It should be noted that the sizes and shapes of the figures in the attached accompanying drawings do not reflect the true scale, and are only intended to schematically illustrate the present disclosure. And the same or similar reference numerals indicate the same or similar elements or elements with the same or similar functions throughout.

Referring to FIG. 1, a display apparatus provided by embodiments of the present disclosure includes a transparent display panel 10 and a driving circuit 20. The driving circuit 20 is connected with the transparent display panel 10 and drives the transparent display panel 10 to display patterns. In some embodiments of the present disclosure, as shown in conjunction with FIG. 1, the transparent display panel 10 may include a plurality of pixel units arranged in an array, where at least one of the plurality of pixel units may include at least one sub-pixel. Exemplarily, each of the plurality of pixel units may include a plurality of sub-pixels. For example, each pixel unit may include sub-pixels of the same color or sub-pixels of different colors. In some examples, each pixel unit may include a red sub-pixel, a green sub-pixel and a blue sub-pixel, so that color mixing may be performed through red, green and blue to realize color display. Alternatively, each pixel unit may also include red sub-pixels, green sub-pixels, blue sub-pixels and white sub-pixels, so that color mixing may be performed through red, green, blue and white to realize color display. Of course, in practical application, the luminous colors of the sub-pixels in the pixel unit may be designed and determined according to the actual application environment, which is not limited here.

In some embodiments of the present disclosure, as shown in conjunction with FIG. 1 to FIG. 5, the transparent display panel 10 may include: a substrate 100, a signal transmission layer 110, an insulating layer 140, a first electrode layer 130, a pixel defining layer 150, a supporting layer 120, a light-emitting layer 160 and a second electrode layer 170. The signal transmission layer 110 is located on the substrate 100; the insulating layer is located on a side, facing away from the substrate 100, of the signal transmission layer 110; the first electrode layer 130 is located on a side, facing away from the substrate 100, of the insulating layer; the pixel defining layer 150 is located on a side, facing away from the substrate 100, of the first electrode layer 130; the supporting layer is located on a side, facing away from the substrate 100, of the pixel defining layer 150; the light-emitting layer 160 is located on a side, facing away from the substrate 100, of the supporting layer; and the second electrode layer 170 is located on a side, facing away from the substrate 100, of the light-emitting layer 160. Exemplarily, in the transparent display panel 10 provided by the embodiments of the present disclosure, the order in which film layers are fabricated on the substrate 100 is as follows: the signal transmission layer 110, the insulating layer 140, the first electrode layer 130, the pixel defining layer 150, the supporting layer 120, the light-emitting layer 160 and the second electrode layer 170. Exemplarily, the supporting layer 120 may have a plurality of supporting portions 121, and orthogonal projections of the supporting portion 121 on the substrate 100 are located in an orthogonal projection of the signal transmission layer 110 on the substrate 100. Exemplarily, the supporting portions 121 are arranged in an array.

Exemplarily, the second electrode layer 170 may be laid on the entire surface of the substrate 100. The light emitting layer 160 may include a monochromatic light emitting layer 160, so that the colors of the sub-pixels may be the same. Alternatively, the light-emitting layer 160 may also include light-emitting layers 160 with different colors, so that the colors of the sub-pixels in the same pixel unit may be different.

In some examples of the present disclosure, the substrate 100 may be at least one of a glass substrate, a silicon-based substrate, and a flexible substrate. In practical application, a specific implementation of the substrate 100 may be determined according to the requirements in practical application, which is not limited here.

In some examples of the present disclosure, a material of the signal transmission layer 110 may be a metal material. Exemplarily, the material of the signal transmission layer 110 may include, but is not limited to, gold, silver, copper and aluminum. In practical application, the specific implementation of the material of the signal transmission layer 110 may be determined according to the requirements in practical application, which is not limited here.

In some examples of the present disclosure, the first electrode layer 130 may be a transparent conductive material. Exemplarily, the transparent conductive material may be, for example, an indium tin oxide (ITO) material, an indium zinc oxide (IZO) material, carbon nanotubes or graphene, etc. The transparent conductive material may also be a metal material after thinning treatment, such as gold thinning to improve transmittance, silver thinning to improve transmittance, aluminum thinning to improve transmittance, etc., which is not limited here.

In some examples of the present disclosure, as shown in conjunction with FIG. 2 to FIG. 5, the first electrode layer 130 may have a plurality of first electrodes arranged at intervals from each other. During specific implementation, the light-emitting layer 160 is arranged between the first electrodes and the second electrodes, that is, the first electrode, the light emitting layer 160 and the second electrode are stacked to form an electroluminescent diode. When different voltages are applied to the first electrode and the second electrode respectively, and a voltage difference between the first electrode and the second electrode is greater than a threshold voltage of the light-emitting layer 160, the light-emitting layer 160 may be excited to emit light, so that the formed electroluminescent diode realizes a light emitting function. Exemplarily, each sub-pixel may include at least one of the plurality of first electrodes. For example, each sub-pixel may include one of the plurality of first electrodes. In this way, one electroluminescent diode may be set arranged in each sub-pixel. Exemplarily, the first electrode may be set as an anode of the electroluminescent diode, and the second electrode layer 170 may be set as a cathode of the electroluminescent diode. Of course, the first electrode may also be set as the cathode of the electroluminescent diode, and the second electrode layer 170 may be set as the anode of the electroluminescent diode, which is not limited here.

In some examples of the present disclosure, each light-emitting layer 160 may be set as an organic material light emitting layer 160, so that the formed electroluminescent diode may be an OLED. Each light-emitting layer 160 may also be set as a quantum dot material light-emitting layer 160, so that the formed electroluminescent diode may be a QLED. Optionally, when each first electrode is arranged as the anode of the electroluminescent diode, a hole injection layer and a hole transport layer may further be arranged between the first electrode and the light-emitting layer 160, and an electron injection layer and an electron transport layer may be arranged between the light-emitting layer 160 and the second electrode. When each first electrode is set as the cathode of the electroluminescent diode, an electron injection layer and an electron transport layer may be set between the light-emitting layer 160 and the first electrode, and a hole injection layer and a hole transport layer may be set between the second electrode and the light-emitting layer 160. Of course, in practical application, the specific implementation of the light-emitting layer 160 may be determined according to the requirements of practical application, which is not limited here.

In the transparent display panel 10 provided by the embodiments of the present disclosure, the first electrodes are patterned without additional pixel circuits in the active matrix organic light-emitting diode (AMOLED), that is, the electroluminescent diodes may be arranged on the substrate 100 in an array and driven in a passive matrix (PM) manner. In this way, the number of film layers of the transparent display panel 10 may be reduced as much as possible, so that the transmittance may be improved. Exemplarily, when the electroluminescent diodes are OLEDs, the transparent display panel 10 provided by the embodiments of the present disclosure can realize a transparent display panel 10 with passive matrix OLEDs (PMOLEDs). When the electroluminescent diodes are QLEDs, the transparent display panel 10 provided by the embodiments of the present disclosure can realize the transparent display panel 10 with passive matrix QLEDs (PMQLEDs).

Figure 2:
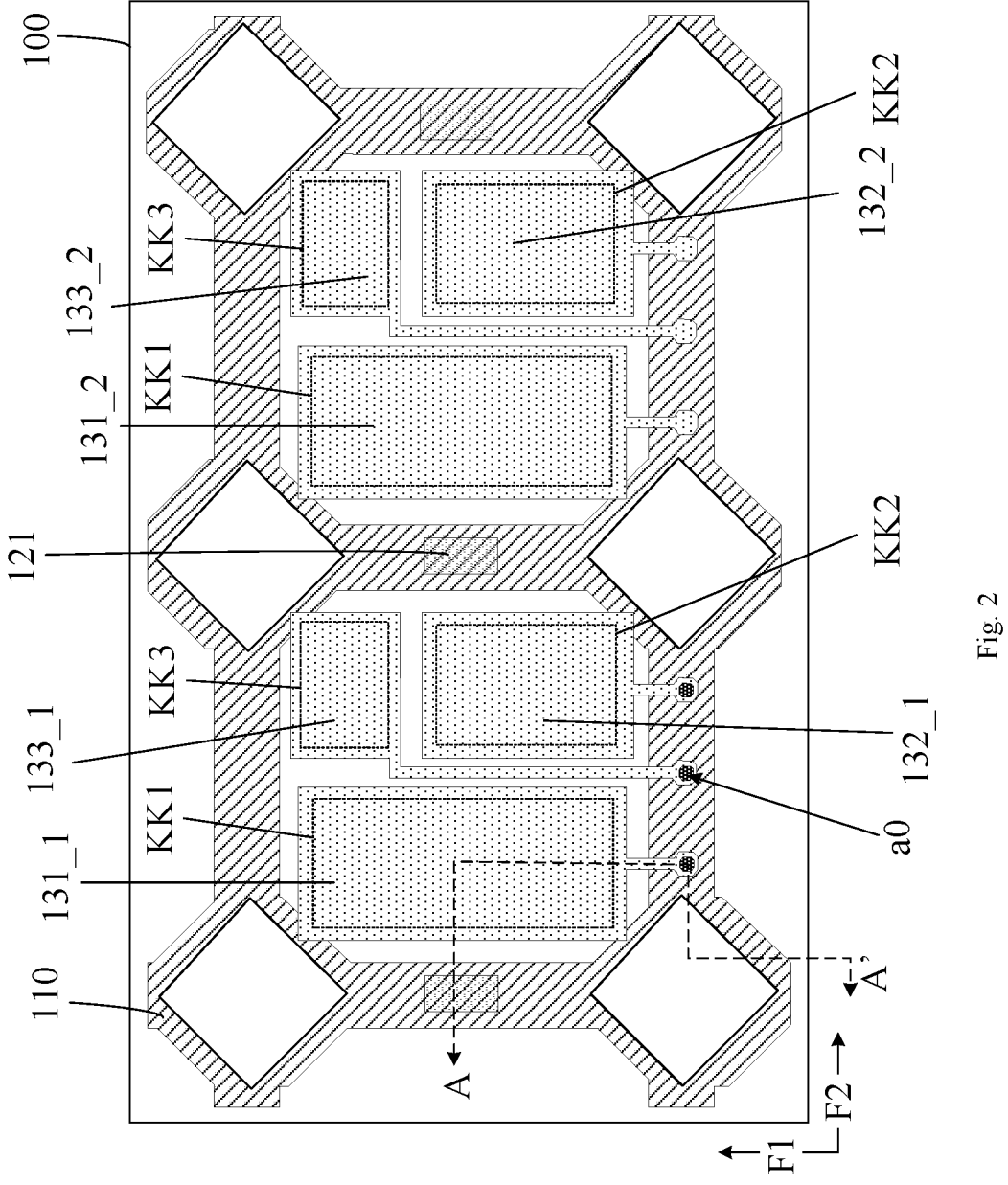
FIG. 2 is a schematic diagram of a layout structure of a transparent display panel provided by an embodiment of the present disclosure.
Figure 3A:
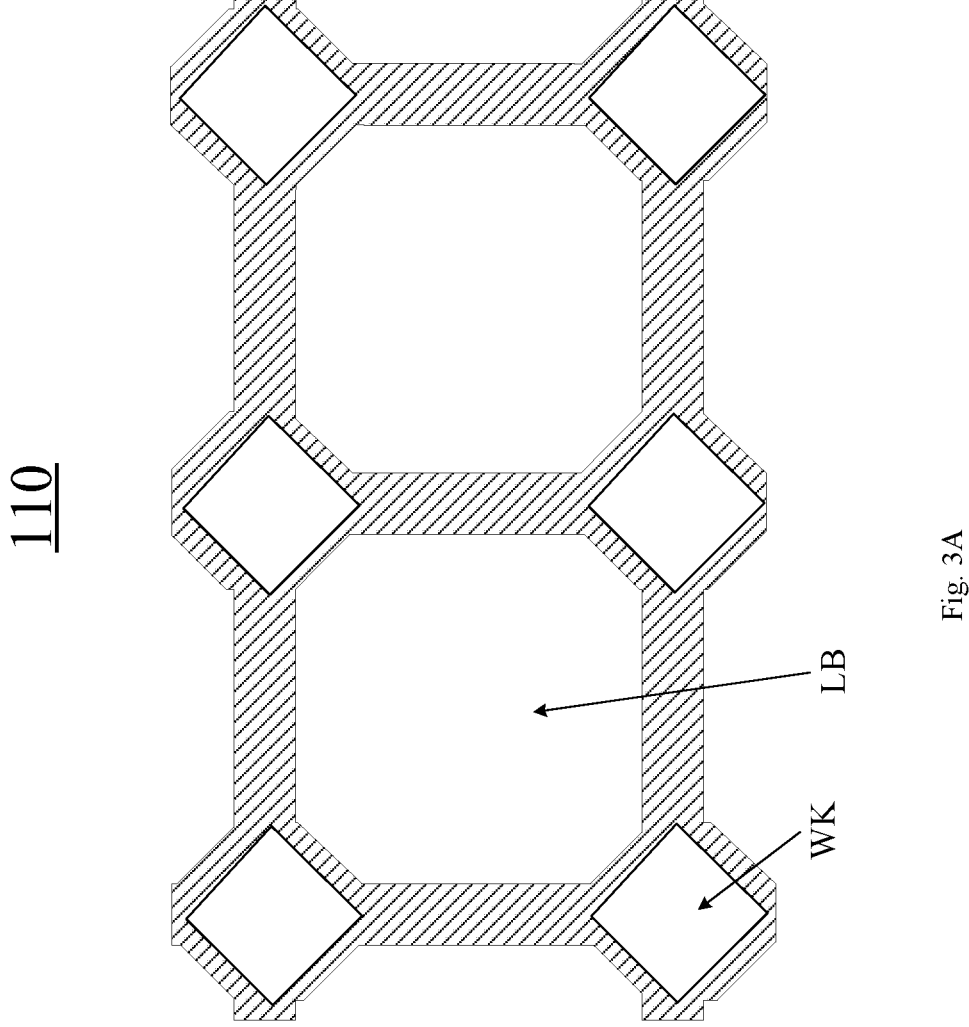
FIG. 3A is a schematic diagram of a layout structure of a signal transmission layer in a transparent display panel provided by an embodiment of the present disclosure.
Figure 3B:
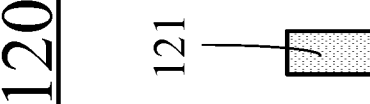
FIG. 3B is a schematic diagram of a layout structure of a supporting layer in a transparent display panel provided by an embodiment of the present disclosure.

In some examples of the present disclosure, the signal transmission layer 110 may have a plurality of hollowed-out areas LB, as shown in conjunction with FIG. 2 and FIG. 3A. Exemplarily, graphics of orthogonal projections of the hollowed-out areas LB on the substrate 100 may be approximately the same. Optionally, the graphics of the orthogonal projections of the hollowed-out areas LB on the substrate 100 include at least one of a diamond, a polygon, a circle and an ellipse. FIG. 2 only illustrates that the orthogonal projections of the hollowed-out areas LB on the substrate 100 are polygonal (i.e., octagonal). In practical application, the graphics of the orthogonal projections of the hollowed-out areas LB on the substrate 100 may be determined according to the requirements of practical application, which not limited here.

In some examples of the present disclosure, as shown in conjunction with FIG. 2 to FIG. 5, the orthogonal projection of at least one of the plurality of first electrodes on the substrate 100 and the orthogonal projection of at least one of the plurality of hollowed-out areas LB on the substrate 100 have an overlapping area. Taking the transparent display panel 10 with PMOLEDs provided by the embodiments of the present disclosure as an example, by setting the overlapping areas between the orthogonal projections of the first electrodes on the substrate 100 and the orthogonal projections of the hollowed-out areas LB on the substrate 100, a shielded area of the PMOLED can be reduced in a direction perpendicular to the substrate 100, so that the transmittance can be improved.

Figure 3C:
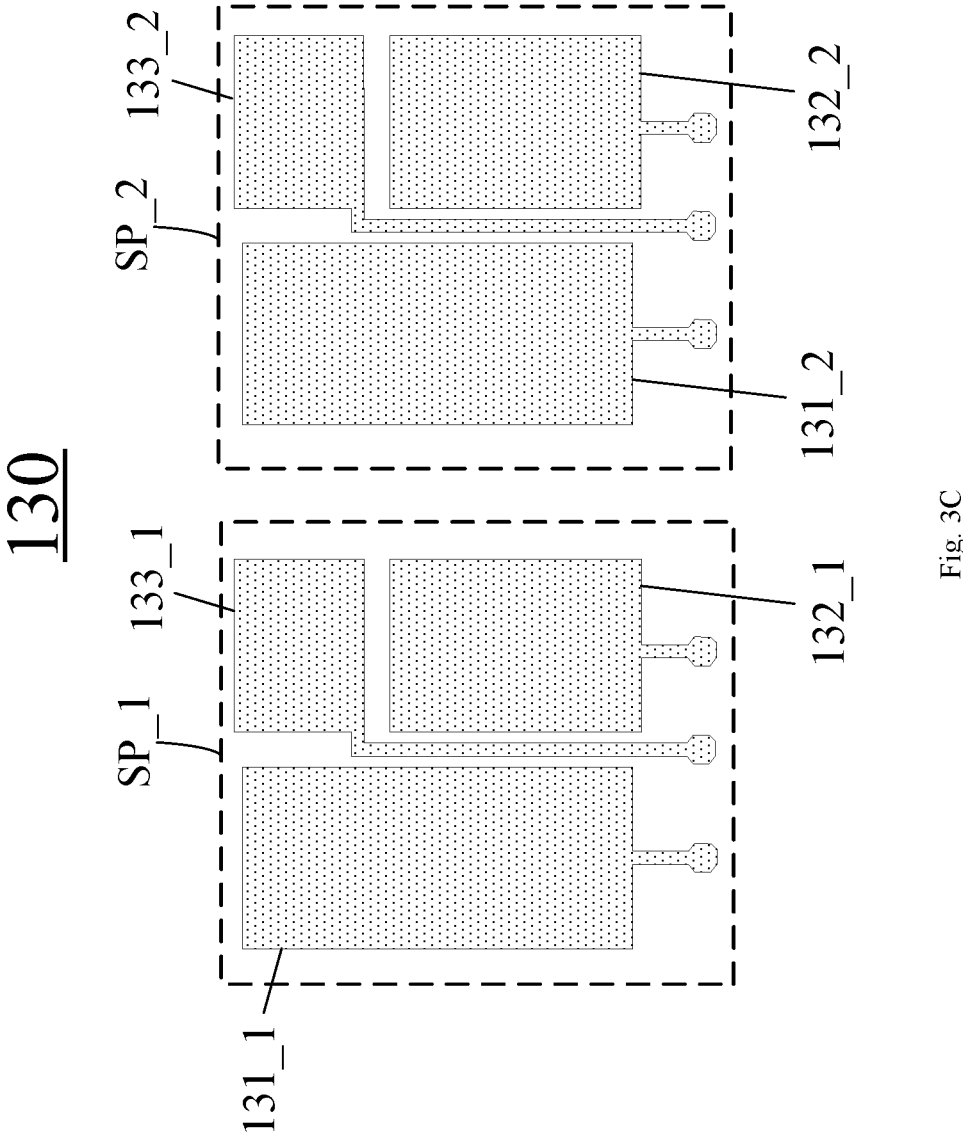
FIG. 3C is a schematic diagram of a layout structure of a first electrode layer in a transparent display panel provided by an embodiment of the present disclosure.

Exemplarily, each hollowed-out area LB may correspond to at least one first electrode one by one, so that the orthogonal projection of each hollowed-out area LB on the substrate 100 and the orthogonal projections of the corresponding first electrodes on the substrate 100 may have overlapping areas. For example, as shown in FIG. 2 and FIG. 3C, each hollow area LB may correspond to three first electrodes one by one. One hollowed-out area LB corresponds to the first electrodes 131_1 to 133_1, and the other hollowed-out area LB corresponds to the first electrodes 131_2 to 133_2. Of course, in practical application, the number of the first electrodes corresponding to each hollowout area LB may be determined according to the requirements of practical application, and the details are not limited here.

Figure 4A:
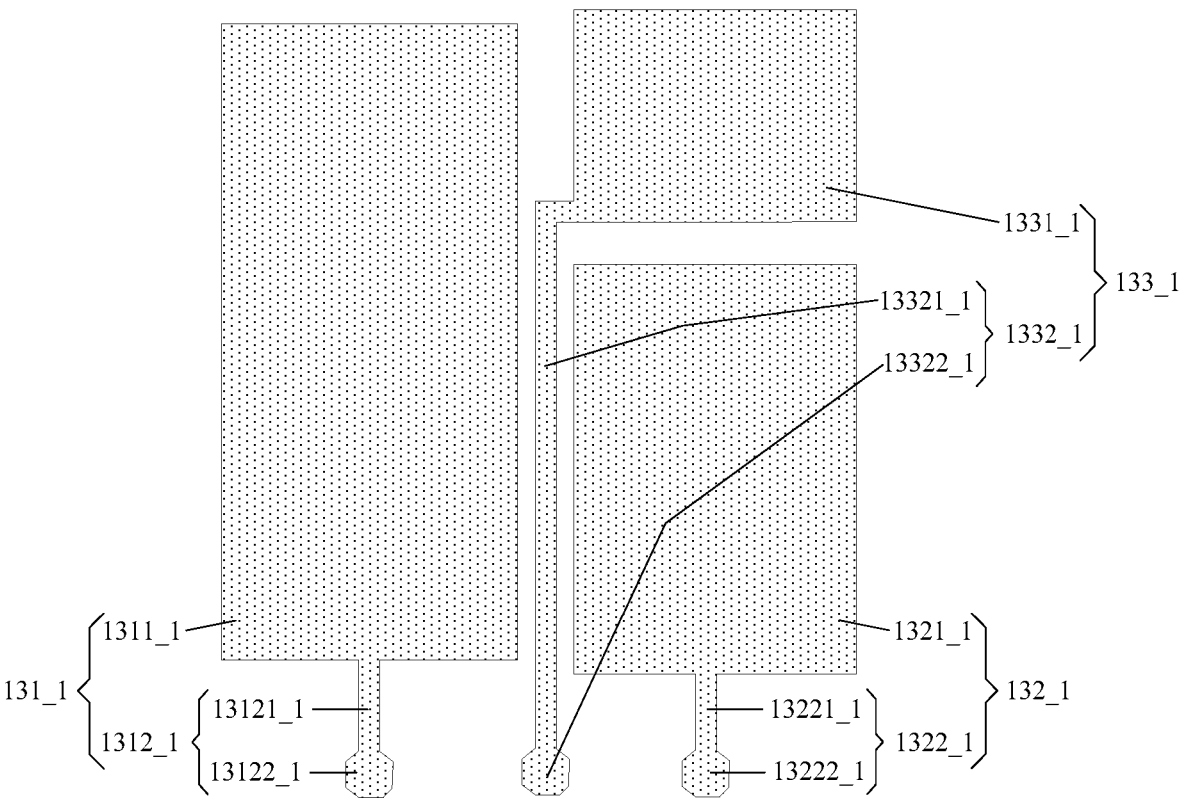
FIG. 4A is a schematic diagram of a layout structure of a pixel unit in a transparent display panel provided by an embodiment of the present disclosure.
Figure 4B:
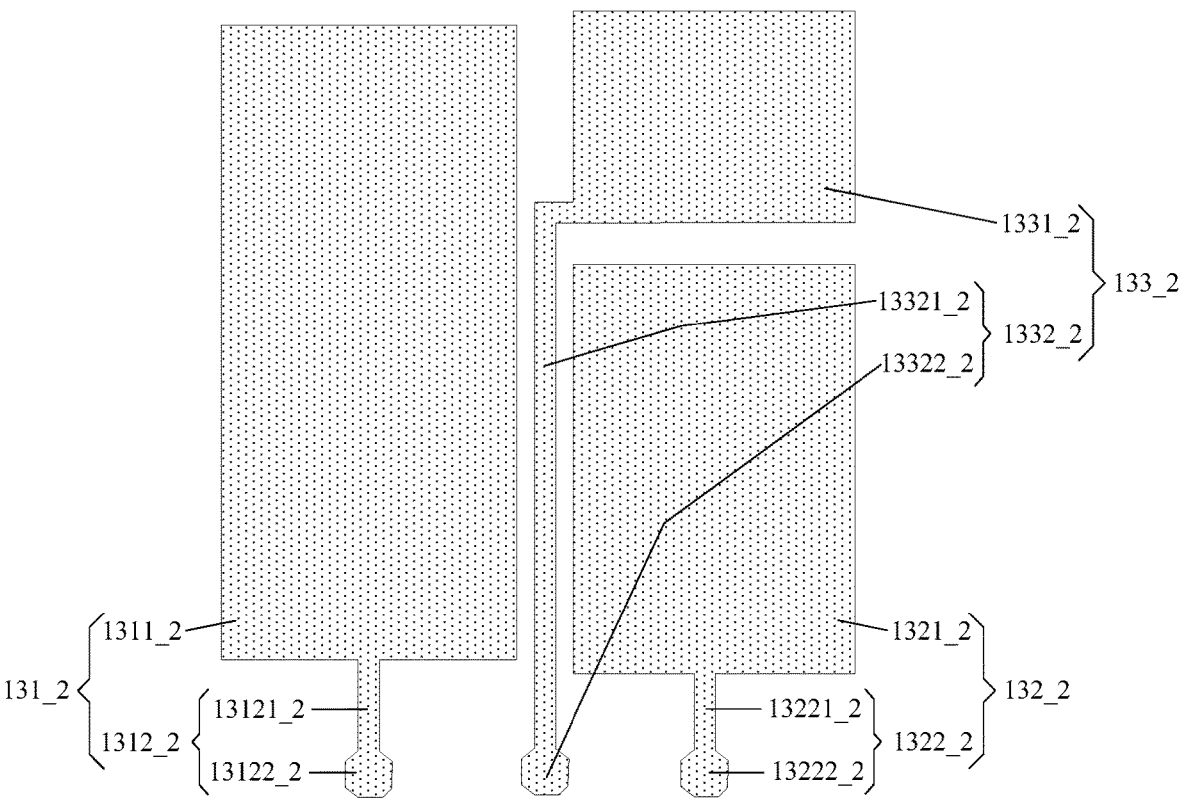
FIG. 4B is a schematic diagram of a layout structure of another pixel unit in a transparent display panel provided by an embodiment of the present disclosure.

In some example of the present disclosure, each first electrode includes an electrode switching part and an electrode main body part which are electrically connected with each other; the orthogonal projection of each hollowed-out area LB on the substrate 100 and the orthogonal projection of the electrode main body part of at least one first electrode on the substrate 100 have an overlapping area; and the orthogonal projections of the electrode switching parts on the substrate 100 and the orthogonal projection of the signal transmission layer 110 on the substrate 100 have overlapping areas. Exemplarily, as shown in FIG. 2, each hollowed-out area LB may correspond to three first electrodes one to one. The orthogonal projection of each hollowed-out area LB on the substrate 100 and orthogonal projections of the electrode main body parts of the corresponding three first electrodes on the substrate 100 have overlapping areas. Exemplarily, as shown in FIG. 2. FIG. 3C. FIG. 4A and FIG. 4B, each first electrode (such as 131_1 to 133_1 and 131_2 to 133_2) may include the electrode switching part (such as 1312_1 to 1332_1 and 1312_2 to 1332_2) and the electrode main body part (such as 1311_1~1331_1 and 1311_2~1331_2) which are electrically connected with each other. The electrode main body parts of which orthogonal projections overlap the orthogonal projection of the same hollowed-out area LB may be located in the same pixel unit, and the electrode main body parts of which orthogonal projections overlap the orthogonal projections of different hollowed-out areas LB are located in different pixel units. Exemplarily, when the orthogonal projections of the electrode main body parts 1311_1 to 1331_1 on the substrate 100 overlaps the orthogonal projection of the same hollowed-out area LB on the substrate 100, the electrode body parts 1311_1 to 1331_1 are located in the pixel unit SP_1. When the orthogonal projections of the electrode main body parts 1311_2 to 1331_2 on the substrate 100 overlap the orthogonal projection of the same hollowed-out area LB on the substrate 100, the electrode main body parts 1311_2 to 1331_2 are located in another pixel unit SP_2. In this way, one hollowed-out area LB may be correspondingly provided with one pixel unit. Because there are many sub-pixels with different colors in the pixel unit, mixed light can be emitted through these sub-pixels with different colors.

In some examples of the present disclosure, as shown in conjunction with FIG. 2. FIG. 4A and FIG. 4B, orthogonal projections of edges of the electrode main body parts (such as 1311_1 to 1331_1, 1311_2 to 1331_2) on the substrate 100 and the orthogonal projection of the signal transmission layer 110 on the substrate 100 have overlapping areas, and orthogonal projections of part of the electrode main body parts (such as 1311_1 to 1331_1, 1311_2 to 1331_2) except the edges on the substrate 100 are located in the orthogonal projections of the hollowed-out areas LB on the substrate 100. Exemplarily, as shown in conjunction with FIG. 2. FIG. 4A, and FIG. 4B, orthogonal projections of the upper left corners of the electrode main body parts 1311_1 and 1311_2 on the substrate 100 and the orthogonal projection of the signal transmission layer 110 on the substrate 100 have overlapping areas, and orthogonal projections of the lower left corners of the electrode main body parts 1311_1 and 1311_2 on the substrate 100 and the orthogonal projection of the signal transmission layer 110 on the substrate 100 have overlapping areas. Orthogonal projections of the upper right corners of the electrode main body parts 1331_1 and 1331_2 on the substrate 100 and the orthogonal projection of the signal transmission layer 110 on the substrate 100 have overlapping areas, and orthogonal projections of the lower right corners of the electrode main body parts 1321_1 and 1321_2 on the substrate 100 and the orthogonal projection of the signal transmission layer 110 on the substrate 100 have overlapping regions. Of course, in order to improve the flatness of the electrode main body parts, the orthogonal projections of the edges of the electrode main body parts on the substrate 100 and the orthogonal projection of the signal transmission layer 110 on the substrate 100 have no overlapping area, which is not limited here.

In some examples of the present disclosure, as shown in conjunction with FIG. 2 and FIG. 3A, the hollowed-out areas LB may be uniformly distributed in the signal transmission layer 110. In this way, the transmittance of different areas in the transparent display panel 10 is as uniform as possible, and the uniformity of the transmittance of different areas is improved. Exemplarily, the hollowed-out areas LB may be arranged in the signal transmission layer 110 in an array. For example, the orthogonal projection of the signal transmission layer 110 on the substrate 100 may be a grid shape. In this way, the uniformity of the transmittance in different areas may be improved as much as possible. In some examples, one hollowed-out area LB may be correspondingly provided with one pixel unit. By arranging the hollowed-out areas LB in an array, the pixel units may also be arranged in an array on the substrate 100, so as to improve the distribution uniformity of the pixel units.

In some examples of the present disclosure, each pixel unit may include a first sub-pixel, a second sub-pixel, and a third sub-pixel. Light-emitting colors of the first sub-pixel, the second sub-pixel and the third sub-pixel may be selected from red, green and blue. For example, the light-emitting color of the first sub-pixel may be red, the light-emitting color of the second sub-pixel may be green, and the light-emitting color of the third sub-pixel may be blue. Of course, in practical application, the light-emitting colors of the first sub-pixel, the second sub-pixel and the third sub-pixel may be determined according to the requirements of practical application, which is not limited here.

In some examples of the present disclosure, the size of the electrode main body part in each first sub-pixel is larger than the size of the electrode main body part in each second sub-pixel, and the size of the electrode main body part in each second sub-pixel is larger than the size of the electrode main body part in each third sub-pixel. Exemplarily, an occupied area of the electrode main body part in each first sub-pixel is larger than an occupied area of the electrode main body part in each second sub-pixel, and the occupied area of the electrode main body part in each second sub-pixel is larger than an occupied area of the electrode main body part in each third sub-pixel. For example, a shape of the electrode main body part in each first sub-pixel may be rectangular, and a long side of the electrode main body part extends in a first direction F1 and a short side extends in a second direction F2. A shape of the electrode main body part in each second sub-pixel may also be rectangular, and the long side of the electrode main body part extends in the first direction F1 and the short side extends in the second direction F2. A shape of the electrode main body part in each third sub-pixel may also be rectangular, and the long side of the electrode main body part extends in the second direction F2 and the short side extends in the first direction F1. Moreover, a length of the long side of the electrode main body part in the first sub-pixel is approximately the same as a sum of a length of the long side of the electrode main body part in the second sub-pixel and a length of the short side of the electrode main body part in the third sub-pixel. A length of the short side of the electrode main body part in the first sub-pixel, a length of the short side of the electrode main body part in the second sub-pixel and a length of the long side of the electrode main body part in the third sub-pixel are approximately the same.

Exemplarily, as shown in FIG. 2. FIG. 3C and FIG. 4A, in the pixel unit SP_1, the first electrode 131_1 is arranged in the first sub-pixel, the first electrode 132_1 is arranged in the second sub-pixel, and the first electrode 133_1 is arranged in the third sub-pixel. Furthermore, the size of the electrode main body part 1311_1 of the first electrode 131_1 is larger than the size of the electrode main body part 1321_1 of the first electrode 132_1, and the size of the electrode main body part 1321_1 of the first electrode 132_1 is larger than the size of the electrode main body part 1331_1 of the first electrode 133_1. Exemplarily, the occupied area of the electrode main body part 1311_1 of the first electrode 131_1 is larger than the occupied area of the electrode main body part 1321_1 of the first electrode 132_1, and the occupied area of the electrode main body part 1321_1 of the first electrode 132_1 is larger than the occupied area of the electrode main body part 1331_1 of the first electrode 133_1. For example, the shape of the electrode main body part 1311_1 of the first electrode 131_1 may be rectangular, and the long side of the electrode main body part 1311_1 extends in the first direction F1 and the short side of the electrode main body part 1311_1 extends in the second direction F2. The shape of the electrode main body parts 1321_1 of the first electrode 132_1 may also be rectangular, and the long side of the electrode main body part 1321_1 extends in the first direction F1 and the short side of the electrode main body part 1321_1 extends in the second direction F2. The shape of the electrode main body part 1331_1 of the first electrode 133_1 may also be rectangular, and the long side of the electrode main body part 1331_1 extends in the second direction F2 and the short side of the electrode main body part 1331_1 extends in the first direction F1. The length of the long side of the electrode main body part 1311_1 of the first electrode 131_1 is approximately the same as the sum of the length of the long side of the electrode main body part 1321_1 of the first electrode 132_1 and the length of the short side of the electrode main body part 1331_1 of the first electrode 133_1. The length of the short side of the electrode main body part 1311_1 of the first electrode 131_1, the length of the short side of the electrode main body part 1321_1 of the first electrode 132_1 and the length of the long side of the electrode main body part 1331_1 of the first electrode 133_1 are approximately the same.

Exemplarily, as shown in FIG. 2. FIG. 3c and FIG. 4b, in the pixel unit SP_2, the first electrode 131_2 is arranged in the first sub-pixel, the first electrode 132_2 is arranged in the second sub-pixel, and the first electrode 133_2 is arranged in the third sub-pixel. Furthermore, the size of the electrode main body part 1311_2 of the first electrode 131_2 is larger than the size of the electrode main body part 1321_2 of the first electrode 132_2, and the size of the electrode main body part 1321_2 of the first electrode 132_2 is larger than the size of the electrode main body part 1331_2 of the first electrode 133_2. Exemplarily, the occupied area of the electrode main body part 1311_2 of the first electrode 131_2 is larger than the occupied area of the electrode main body part 1321_2 of the first electrode 132_2, and the occupied area of the electrode main body part 1321_2 of the first electrode 132_2 is larger than the occupied area of the electrode main body part 1331_2 of the first electrode 133_2. For example, the shape of the electrode main body part 1311_2 of the first electrode 131_2 may be rectangular, and the long side of the electrode main body part 1311_2 extends in the first direction F1 and the short side of the electrode main body part 1311_2 extends in the second direction F2. The shape of the electrode main body part 1321_2 of the first electrode 132_2 may also be rectangular, and the long side of the electrode main body part 1321_2 extends in the first direction F1 and the short side of the electrode main body part 1321_2 extends in the second direction F2. The shape of the electrode main body part 1331_2 of the first electrode 133_2 may also be rectangular, and the long side of the electrode main body part 1331_2 extends in the second direction F2 and the short side of the electrode main body part 1331_2 extends in the first direction F1. The length of the long side of the electrode main body part 1311_2 of the first electrode 131_2 is approximately the same as the sum of the length of the long side of the electrode main body part 1321_2 of the first electrode 132_2 and the length of the short side of the electrode main body part 1331_2 of the first electrode 133_2. The length of the short side of the electrode main body part 1311_2 of the first electrode 131_2, the length of the short side of the electrode main body part 1321_2 of the first electrode 132_2 and the length of the long side of the electrode main body part 1331_2 of the first electrode 133_2 are approximately the same.

In some examples of the present disclosure, in the same pixel unit, the electrode main body part in the second sub-pixel and the electrode main body part in the third sub-pixel are arranged in the first direction F1, and form a main body part group. Moreover, in the same pixel unit, the electrode main body part in the first sub-pixel and the main body part group are arranged in the second direction F2. Exemplarily, as shown in FIG. 2. FIG. 3C, and FIG. 4A, in the pixel unit SP_1, the electrode main body parts 1321_1 and 1331_1 are arranged in the first direction F1, and form a main body group; and the main body group and the electrode main body part 1311_1 are arranged in the second direction F2. Exemplarily, as shown in FIG. 2. FIG. 3C and FIG. 4B, in the pixel unit SP_2, the electrode main body parts 1321_2 and 1331_2 are arranged in the first direction F1, and form a main body group; and the main body group and the electrode main body part 1311_2 are arranged in the second direction F2. Of course, in practical application, in the same pixel unit, the arrangement mode of the electrode main body part in the first sub-pixel, the electrode main body part in the second sub-pixel and the electrode main body part in the third sub-pixel may be determined according to the requirements of practical application, which is not limited here.

In some examples of the present disclosure, as shown in FIG. 2, in each pixel unit, the electrode main body part in the first sub-pixel, the electrode main body part in the second sub-pixel and the electrode main body part in the third sub-pixel may be arranged in the same way. Exemplarily, as shown in FIG. 2. FIG. 3C. FIG. 4A and FIG. 4B, the electrode main body parts 1311_1 to 1331_1 in the pixel unit SP_1 and 1311_2 to 1331_2 in the pixel unit SP_2 may be arranged in the same way. Of course, in different pixel units, the electrode main body part in the first sub-pixel, the electrode main body part in the second sub-pixel and the electrode main body part in the third sub-pixel may be arranged in different ways, which is not limited here.

In some examples of the present disclosure, as shown in FIG. 2, the pixel defining layer 150 has a plurality of openings (such as KK1, KK2, KK3), where, the first electrodes are arranged in one-to-one correspondence with the openings. In addition, the orthogonal projections of the electrode main body parts of the first electrodes on the substrate 100 cover the orthogonal projections of the corresponding openings on the substrate 100. Exemplarily, the orthogonal projections of the electrode main body parts 1311_1 and 1311_2 on the substrate 100) cover the orthogonal projections of the corresponding openings KK1 on the substrate 100. The orthogonal projections of the electrode main body parts 1321_1 and 1321_2 on the substrate 100 cover the orthogonal projections of the corresponding openings KK2 on the substrate 100. The orthogonal projections of the electrode main body parts 1331_1 and 1331_2 on the substrate 100 cover the orthogonal projections of the corresponding openings KK3 on the substrate 100.

In some examples of the present disclosure, as shown in FIG. 2, the orthogonal projections of the openings corresponding to the electrode main body parts in the first sub-pixels on the substrate 100 do not overlap with the signal transmission layer 110. In this way, the light-emitting performance of the electroluminescent diodes in the first sub-pixels may be improved. Exemplarily, as shown in FIG. 2, FIG. 3C, FIG. 4A and FIG. 4B, the orthogonal projections of the openings KK1 corresponding to the electrode main body parts 1311_1 and 1311_2 on the substrate 100 do not overlap with the signal transmission layer 110.

In some examples of the present disclosure, as shown in FIG. 2, the orthogonal projections of the openings corresponding to the electrode main body parts in the second sub-pixels on the substrate 100 do not overlap with the signal transmission layer 110. In this way, the light-emitting performance of the electroluminescent diodes in the second sub-pixels may be improved. Exemplarily, as shown in FIG. 2, FIG. 3C, FIG. 4A and FIG. 4B, the orthogonal projections of the openings KK2 corresponding to the electrode main body parts 1321_1 and 1321_2 on the substrate 100 do not overlap with the signal transmission layer 110.

In some examples of the present disclosure, as shown in FIG. 2, the orthogonal projections of the edges of the openings corresponding to the electrode main body parts in the third sub-pixels on the substrate 100 have overlapping areas with the signal transmission layer 110. For example, the orthogonal projections of the upper right corners of the openings corresponding to the electrode main body parts in the third sub-pixels on the substrate 100 have overlapping areas with the signal transmission layer 110. Because the overlapping areas are small, the influence on light-emitting is small or even negligible. Exemplarily, as shown in FIG. 2, FIG. 3C, FIG. 4A and FIG. 4B, the orthogonal projections of the upper right corners of the openings KK3 corresponding to the electrode main body parts 1331_1 and 1331_2 on the substrate 100 have overlapping areas with the signal transmission layer 110. Of course, the orthogonal projections of the upper right corners of the openings KK3 corresponding to the electrode main body parts 1331_1 and 1331_2 on the substrate 100 may not overlap the signal transmission layer 110.

In some examples of the present disclosure, the electrode switching part of at least one of the plurality of first electrodes is electrically connected with the signal transmission layer 110 through at least one electrode through-hole; where the electrode through-holes penetrate through the insulating layer. Exemplarily, the electrode switching part of at least one of the plurality of first electrodes may be electrically connected with the signal transmission layer 110 through an electrode through-hole. Thus, a voltage may be applied to the first electrodes through the signal transmission layer 110. Of course, in practical application, the number of the electrode through-holes corresponding to the electrode switching parts of the first electrodes may be determined according to the requirements of practical application, which is not limited here.

In some examples of the present disclosure, the electrode switching parts of a part of the plurality of first electrodes are electrically connected with the signal transmission layer 110 through the electrode through-holes, and the electrode switching parts of the rest of the first electrodes are in a floating state. In this way, only the voltage is applied to the first electrodes electrically connected with the signal transmission layer 110 through the electrode through-holes, so that only the corresponding electroluminescent diodes formed at this part of the first electrodes can emit light. However, no voltage is applied to the first electrodes of which the electrode switching parts are in the floating state, so that only the electroluminescent diodes formed at this part of the first electrodes cannot emit light. Exemplarily, as shown in conjunction with FIG. 2, FIG. 4A, FIG. 4B and FIG. 5, the electrode switching parts (such as 1312_1 to 1332_1) of the first electrodes (such as 131_1 to 133_1) in the pixel unit SP_1 are electrically connected with the signal transmission layer 110 through the electrode through-hole TK, and the electrode switching parts (such as 1312_2 to 1332_2) of the first electrodes (such as 131_2 to 133_2) in the pixel unit SP_2 are in a floating state. On the substrate 100, a plurality of pixel units SP_1 and SP_2 may be arranged to realize picture display. In this way, when the transparent display panel 10 provided by the embodiments of the present disclosure is driven to display a picture, the picture to be displayed (such as graphics, characters, logos, etc.) may be presented through the light-emitting electroluminescent diodes, and a light transmission function of a transparent area may be realized through an area where non-luminous electroluminescent diodes are located.

In some examples of the present disclosure, as shown in conjunction with FIG. 2, the electrode switching parts electrically connected with the electrode main body parts of which orthogonal projections overlap the orthogonal projections of some of the plurality of hollowed-out areas LB are electrically connected with the signal transmission layer 110 through electrode through-holes, and the electrode switching parts electrically connected with the electrode main body parts of which orthogonal projections overlap the orthogonal projection of the rest of the plurality of hollowed-out areas LB are in a floating state. Exemplarily, as shown in FIG. 2, FIG. 4A, FIG. 4B and FIG. 5, the electrode switching parts (such as 1312_1~1332_1) electrically connected with the electrode main body parts (such as 1311_1~1331_1) of which orthogonal projections overlap the orthogonal projection of the hollowed-out area LB corresponding to the pixel unit SP_1 are electrically connected with the signal transmission layer 110 through the electrode through-hole TK. The electrode switching parts (such as 1312_2~1332_2) electrically connected with the electrode main body parts (such as 1311_2~1331_2) of which orthogonal projections overlap the orthogonal projection the hollowed-out area LB corresponding to the pixel unit SP_2 are in a floating state. Since one hollowed-out area LB may be provided with one pixel unit correspondingly, the electrode main body parts of which orthogonal projections overlap the orthogonal projection of part of the hollowed-out areas LB may be electrically connected with the signal transmission layer 110, and the electrode main body parts of which orthogonal projections overlap the orthogonal projection of the rest of the hollowed-out areas LB may be in a floating state, so that the voltage may be applied to the electrode main body parts in the pixel unit SP_1, and no voltage is applied to the electrode main body parts in the pixel unit SP_2, so that the electroluminescent diodes that need to emit light and the electroluminescent diodes that don't need to emit light can be set according to the whole pixel unit.

Figure 5:
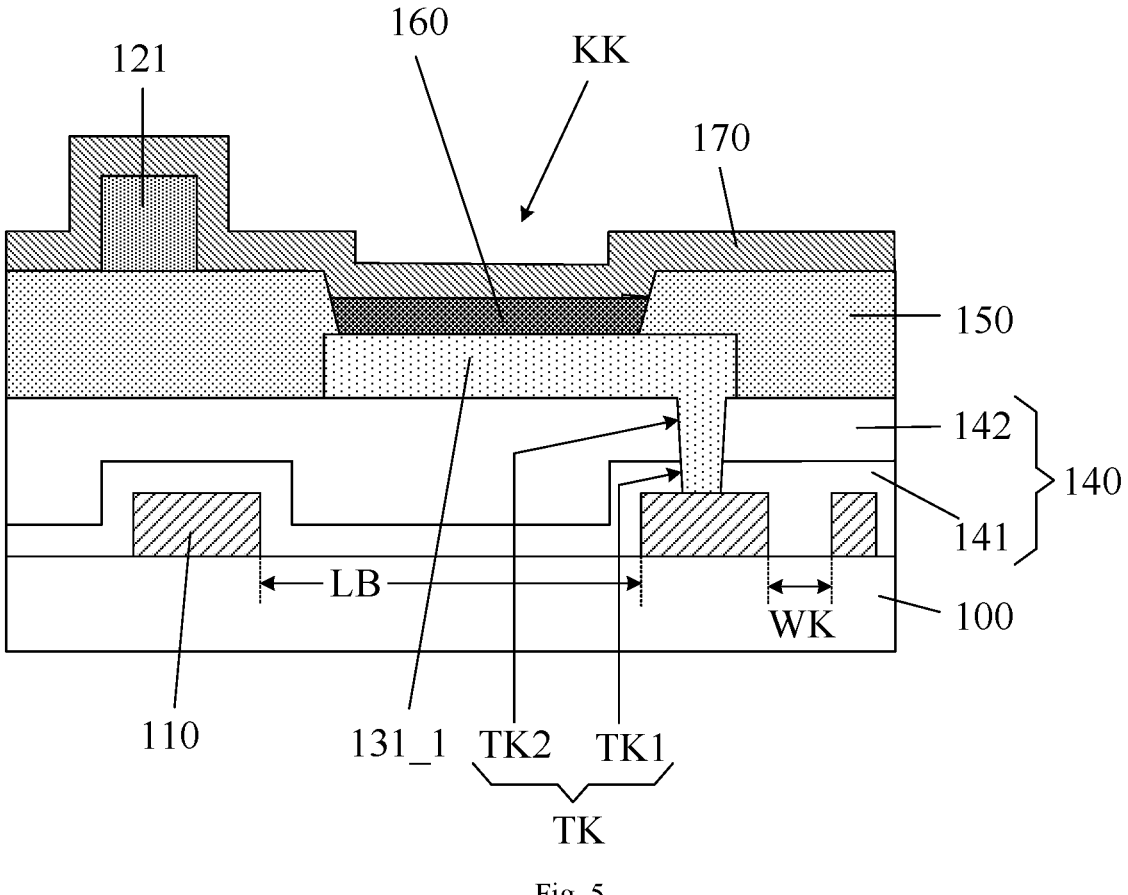
FIG. 5 is a schematic structural sectional view of a transparent display panel as shown in FIG. 2 in a direction of AA'.

In some examples of the present disclosure, as shown in FIG. 5, the insulating layer 140 may include an interlayer insulating layer 141 and a planarization layer 142, where the interlayer insulating layer 141 is located between the signal transmission layer 110 and the first electrode layer 130, and the planarization layer 142 is located between the interlayer insulating layer 141 and the first electrode layer 130. Exemplarily, the interlayer insulating layer 141, the planarization layer 142, and the pixel defining layer 150 may all adopt insulating materials with high light transmittance. Of course, in practical application, the specific materials used for the interlayer insulating layer 141, the planarization layer 142 and the pixel defining layer 150 may be determined according to the requirements of practical application, which is not limited here.

In some examples of the present disclosure, as shown in FIG. 5, the same electrode through-hole TK may include a first electrode through-hole TK1 and a second electrode through-hole TK2. The first electrode through-hole TK1 penetrates through the interlayer insulating layer 141, and the second electrode through-hole TK2 penetrates through the planarization layer 142. The orthogonal projection of the second electrode through-hole TK2 on the substrate 100 covers the orthogonal projection of the first electrode through-hole TK1 on the substrate 100. Thus, the penetration performance of the electrode through-holes formed by the second electrode through-holes TK2 and the first electrode through-holes TK1 may be improved, and the electrical connection performance between the electrode switching parts and the signal transmission layer 110 may be improved.

In some examples of the present disclosure, as shown in FIG. 2, in the same electrode through-hole TK, the edge of the orthogonal projection of the second electrode through-hole TK2 on the substrate 100 and the edge of the orthogonal projection of the first electrode through-hole TK1 on the substrate 100 have a second set distance. In this way, the penetration performance of the electrode through-holes formed by the second electrode through-holes TK2 and the first electrode through-holes TK1 may be further improved, and the electrical connection performance between the electrode switching parts and the signal transmission layer 110 is further improved.

In some examples of the present disclosure, as shown in FIG. 2, the electrode through-holes TK corresponding to the electrode main body parts of which orthogonal projections overlap the orthogonal projection of the same hollowed-out area LB are located at the same side of the hollowed-out area LB. Exemplarily, as shown in FIG. 2, the figure of the orthogonal projection of the hollowed-out area LB on the substrate 100 is octagonal, and the electrode through-holes TK corresponding to the electrode main body parts (such as 1311_1~1311_3) of which orthogonal projections overlap the orthogonal projection of the same hollowed-out area LB are located on the same side (such as the lower side) of the octagonal hollowed-out area LB. In this way, the uniformity of the electrode through-holes may be improved.

In some examples of the present disclosure, as shown in FIG. 2, the electrode through-holes TK corresponding to the electrode main body parts (such as 1311_1 to 1311_3) of which orthogonal projections are covered by the orthogonal projection of at least part of the hollowed-out areas LB are located at the same side of the hollowed-out areas LB. Exemplarily, as shown in FIG. 2, the figures of the orthogonal projections of the hollowed-out areas LB on the substrate 100 are octagonal, and the electrode through-holes corresponding to the electrode main body parts of which orthogonal projections are covered by the orthogonal projection of at least part of the hollowed-out areas LB may be located at one side of the octagonal hollowed-out area LB at the same position. That is, when a plurality of pixel units SP_1 are arranged, the electrode through-holes TK corresponding to the electrode main body parts (such as 1311_1 to 1311_3) are located on the same side (lower side) of the octagonal hollowed-out areas LB. In this way, the uniformity of the electrode through-holes may be further improved.

In some examples of the present disclosure, as shown in FIG. 2, each electrode switching part may include an electrode extension part and a through-hole connection part. Where, in the same first electrode, the electrode main body part is electrically connected with the through-hole connection part through the electrode extension part; the through-hole connection parts of part of the first electrodes are electrically connected with the signal transmission layer 110 through the electrode through-holes, and the through-hole connection parts of the rest of the first electrodes are in a floating state; and the through-hole connection parts of the first electrodes are located at the same side of the first electrodes. For the first electrodes electrically connected with the signal transmission layer 110, the orthogonal projections of the through-hole connection parts in the first electrodes on the substrate 100 covers the orthogonal projections of the corresponding electrode through-holes TK on the substrate 100, and the through-hole connection parts in the first electrodes are electrically connected with the signal transmission layer 110 through the electrode through-holes of which orthogonal projections are covered by the orthogonal projections of the through-hole connection parts. For the first electrodes in the floating state, that is, the first electrode not electrically connected with the signal transmission layer 110, the orthogonal projections of the through-hole connection parts in the first electrodes on the substrate 100 does not cover the orthogonal projections of the electrode through-holes on the substrate 100, that is, there is no electrode through-hole corresponding to the first electrodes in the floating state, and in this way, these first electrodes may be prevented from being electrically connected with the signal transmission layer 110.

Exemplarily, as shown in FIG. 2 and FIG. 4A to FIG. 5, in the pixel unit SP_1, the electrode switching part 1312_1 of the first electrode 131_1 in the first sub-pixel includes an electrode extension part 13121_1 and a through-hole connection part 13122_1, and the electrode main body part 1311_1 is electrically connected with the through-hole connection part 13122_1 through the electrode extension part 13121_1. The electrode switching part 1322_1 of the first electrode 132_1 in the second sub-pixel includes an electrode extension part 13221_1 and a through-hole connection part 13222_1, and the electrode main body part 1321_1 is electrically connected with the through-hole connection part 13222_1 through the electrode extension part 13221_1. The electrode switching part 1332_1 of the first electrode 133_1 in the third sub-pixel includes an electrode extension part 13321_1 and a through-hole connection part 13322_1, and the electrode main body part 1331_1 is electrically connected with the through-hole connection part 13322_1 through the electrode extension part 13321_1. In the pixel unit SP_2, the electrode switching part 1312_2 of the first electrode 131_2 in the first sub-pixel includes an electrode extension part 13121_2 and a through-hole connection part 13122_2, and the electrode main body part 1311_2 is electrically connected with the through-hole connection part 13122_2 through the electrode extension part 13121_2. The electrode switching part 1322_2 of the first electrode 132_2 in the second sub-pixel includes an electrode extension part 13221_2 and a through-hole connection part 13222_2, and the electrode main body part 1321_2 is electrically connected with the through-hole connection part 13222_2 through the electrode extension part 13221_2. The electrode switching part 1332_2 of the first electrode 133_2 in the third sub-pixel includes an electrode extension part 13321_2 and a through-hole connection part 13322_2, and the electrode main body part 1331_2 is electrically connected with the through-hole connection part 13322_2 through the electrode extension part 13321_2. The through-hole connection parts 13122_1, 13222_1 and 13322_1 are respectively electrically connected with the signal transmission layer 110 through the electrode through-holes TK, and the first electrodes 131_1 to 133_1 are electrically connected with the signal transmission layer 110. The through-hole connection parts 13122_2, 13222_2 and 13322_2 are not electrically connected with the signal transmission layer 110 respectively through the electrode through-holes TK, and the first electrodes 131_2 to 133_2 are not electrically connected with the signal transmission layer 110, but are in a floating state.

In some examples of the present disclosure, in the same pixel unit, the electrode extension part in the third sub-pixel may be located between the electrode extension part in the first sub-pixel and the electrode extension part in the second sub-pixel. Exemplarily, in the same pixel unit, a distance between the electrode extension part in the third sub-pixel and the electrode extension part in the first sub-pixel may be approximately the same as a distance between the electrode extension part in the third sub-pixel and the electrode extension part in the second sub-pixel. Exemplarily, as shown in FIG. 2. FIG. 3C. FIG. 4A and FIG. 4B, in the pixel unit SP_1, the electrode extension part 13321_1 is located between the electrode extension part 13121_1 and the electrode extension part 13221_1. Further, a distance between the electrode extension part 13321_1 and the electrode extension part 13121_1 is approximately the same as a distance between the electrode extension part 13321_1 and the electrode extension part 13221_1. In the pixel unit SP_2, the electrode extension part 13321_2 is located between the electrode extension part 13121_2 and the electrode extension part 13221_2. Moreover, a distance between the electrode extension part 13321_2 and the electrode extension part 13121_2 is approximately the same as a distance between the electrode extension part 13321_2 and the electrode extension part 13221_2.

In some examples of the present disclosure, in the same pixel unit, the electrode main body part in the third sub-pixel is located on the side, facing away from the through-hole connection part in the second sub-pixel, of the electrode main body part in the second sub-pixel. The electrode main body part in the second sub-pixel is located between the electrode main body part in the third sub-pixel and the through-hole connection part in the second sub-pixel. Exemplarily, as shown in conjunction with FIG. 2, FIG. 3C, FIG. 4A and FIG. 4B, in the pixel unit SP_1, the electrode main body part 1331_1 is located on the side, facing away from the through-hole connection part 13222_1, of the electrode main body part 1321_1; and the electrode main body part 1321_1 is located between the electrode main body part 1331_1 and the through-hole connection part 13222_1. In the pixel unit SP_2, the electrode main body part 1331_2 is located on the side, facing away from the through-hole connection part 13222_2, of the electrode main body part 1321_2; and the electrode main body part 1321_2 is located between the electrode main body part 1331_2 and the through-hole connection part 13222_2.

In some examples of the present disclosure, in the same pixel unit, the electrode extension part in the third sub-pixel extends and is arranged in a gap between the electrode main body part in the first sub-pixel and the electrode main body part in the second sub-pixel. Exemplarily, as shown in FIG. 2, FIG. 3C, FIG. 4A and FIG. 4B, in the pixel unit SP_1, the electrode extension part 13321_1 is located in a gap between the electrode main body part 1311_1 and the electrode main body part 1321_1. In the pixel unit SP_2, the electrode extension part 13321_2 is located in a gap between the electrode main body part 1311_2 and the electrode main body part 1321_2.

In some examples of the present disclosure, as shown in FIG. 2, the mesh connection of the signal transmission layer 110 may be formed in a solid manner.

In some examples of the present disclosure, as shown in conjunction with FIG. 2, FIG. 3A and FIG. 5, at least one mesh connection of the signal transmission layer 110 may have a perforative digging hole WK. In this way, the transmittance may be improved. Exemplarily, each mesh connection of the signal transmission layer 110 has a perforative digging hole WK. In this way, the transmittance may be improved as much as possible. Exemplarily, some of mesh connections in the signal transmission layer 110 may have perforative digging holes WK, and the rest of the mesh connections may not have perforative digging holes WK, which is not limited here.

Exemplarily, in the transparent display panel 10 provided by the embodiments of the present disclosure, by setting the digging holes WK in the signal transmission layer 110, a proportion of the signal transmission layer 110 on the substrate 100 may be reduced from 31% when no digging hole WK is arranged to 20.19%, a proportion of anodes on the substrate 100 is approximately 50.07%, and a proportion of a blank area is increased from 18.93% when no digging hole WK is arranged to 29.74%. Exemplarily, when a thickness of the first electrode is 0.01 nm, the transmittance of the transparent display panel 10 is approximately 21.99%.

Figure 6:
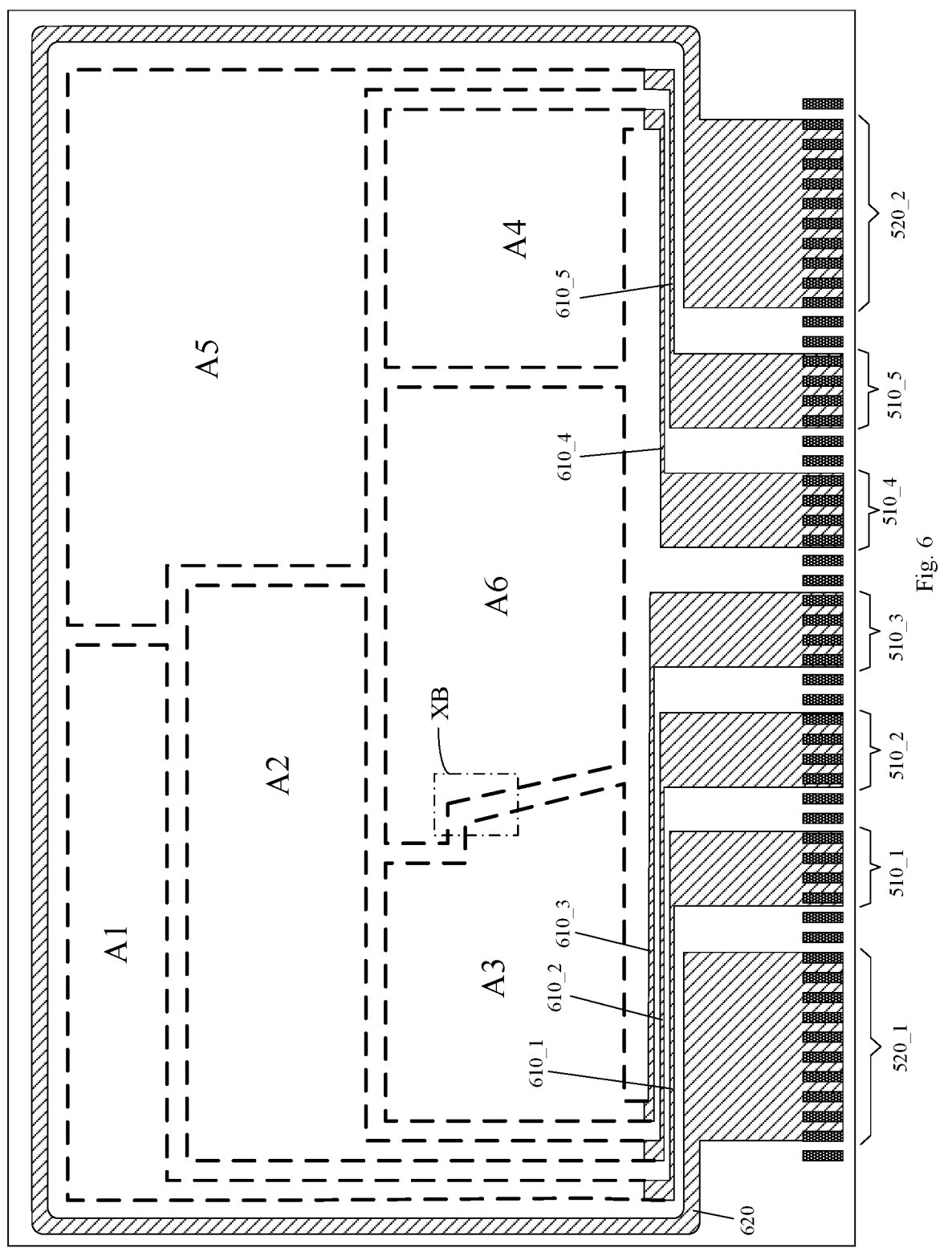
FIG. 6 is another schematic structural diagram of a transparent display panel provided by an embodiment of the present disclosure.
Figure 7:
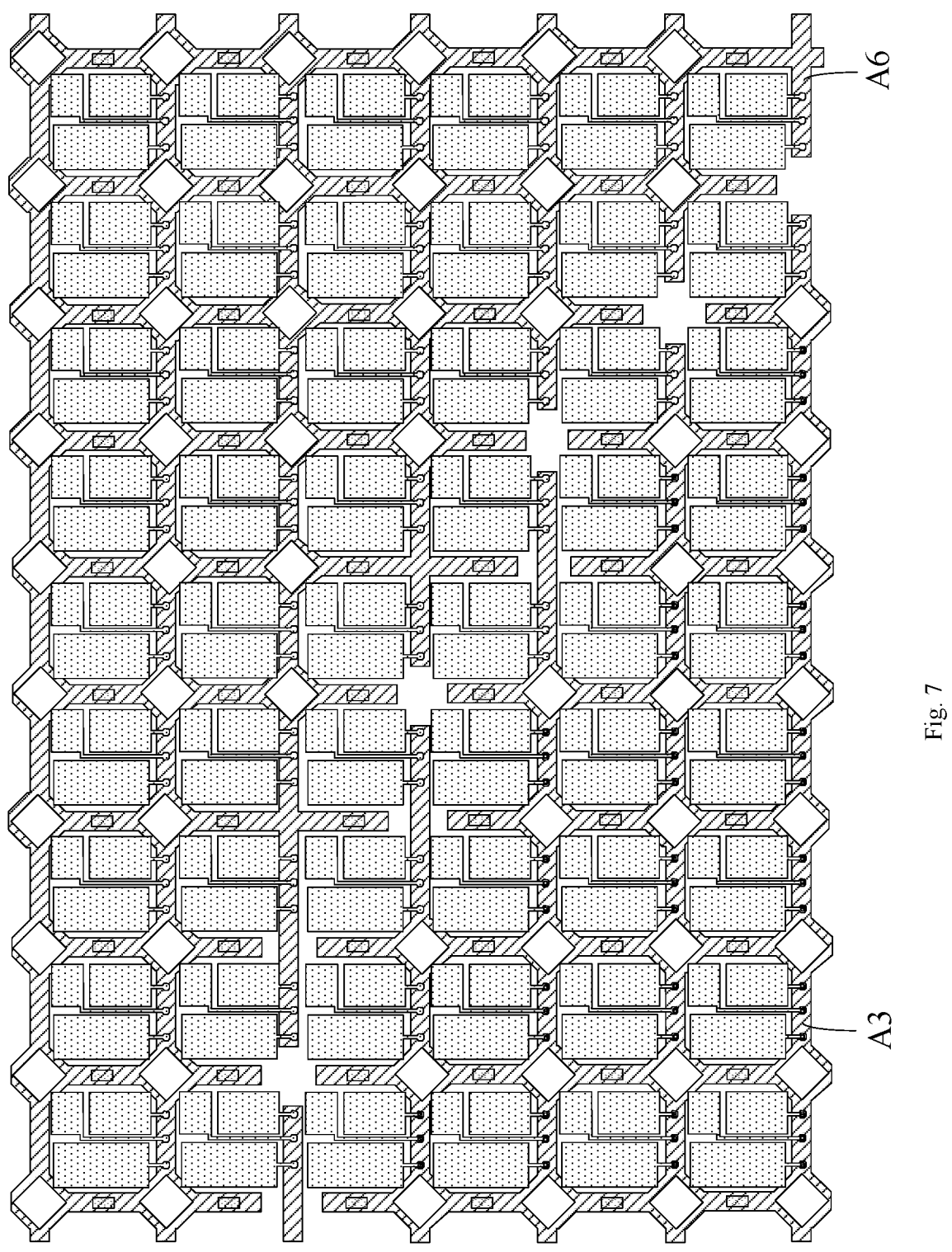
FIG. 7 is a schematic diagram of some layout structures in an XB area in a transparent display panel as shown in FIG. 6.
Figure 8:
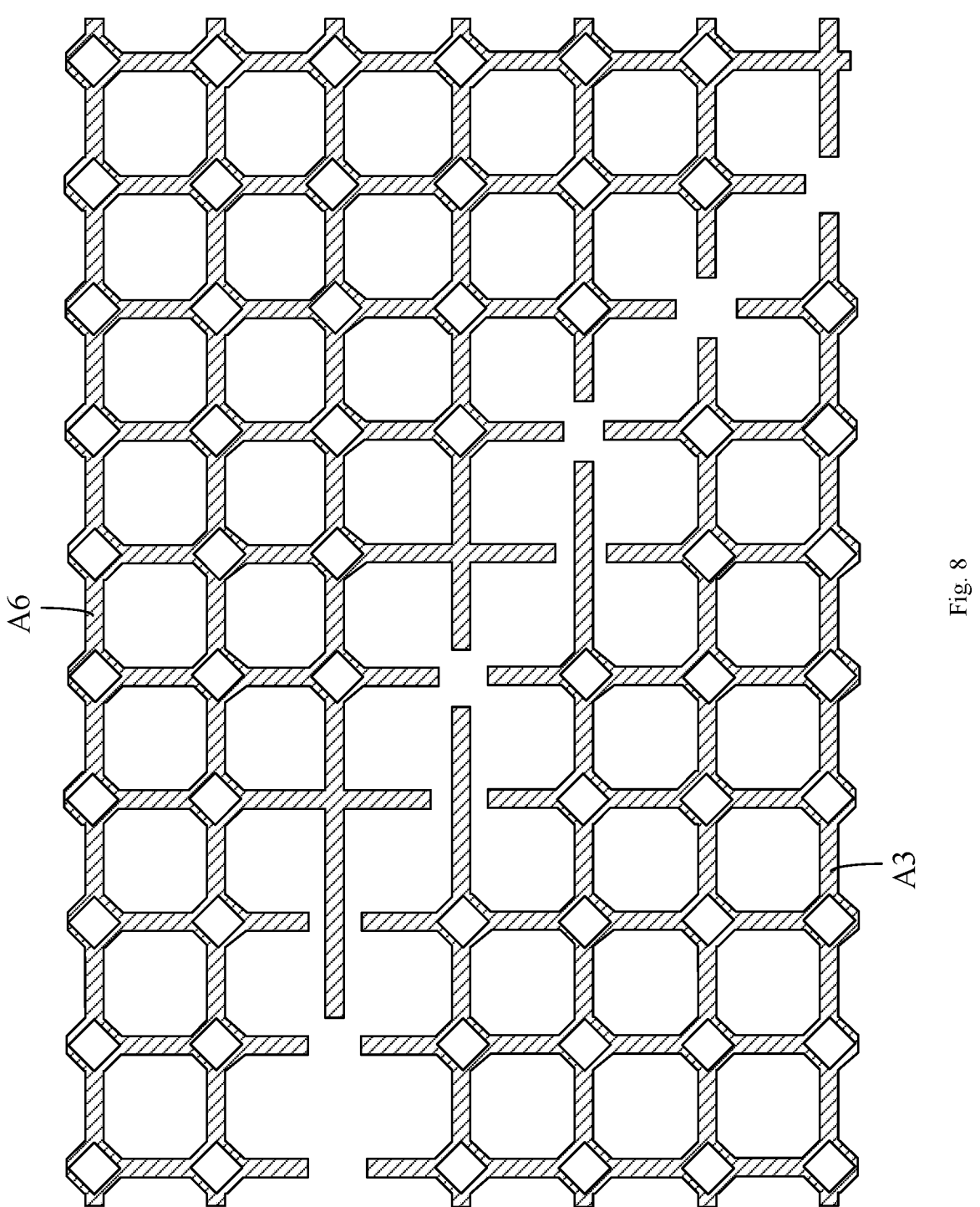
FIG. 8 is a schematic diagram of other layout structures of a signal transmission layer in a transparent display panel provided by an embodiment of the present disclosure.

In some examples of the present disclosure, as shown in combination with FIG. 6 to FIG. 8, the signal transmission layer 110 is divided into a plurality of signal transmission parts (for example, A1 to A6) which are insulated from each other, and each signal transmission part has a hollowed-out area LB; and the electrode switching parts corresponding to at least part of the hollowed-out areas LB in at least one signal transmission part is electrically connected with the signal transmission layer 110 through the electrode through-holes. Because the signal transmission parts are insulated from each other, at least part of the signal transmission parts may transmit different voltages, so that an image displayed by the transparent display panel 10 may have various brightness. Exemplarily, for the signal transmission parts electrically connected with the electrode switching parts, each signal transmission part may transmit different voltages, so that the image displayed by the transparent display panel 10 can have various brightness. Of course, in practical application, part of signal transmission parts may transmit different voltages, and the rest of the signal transmission parts may transmit the same voltage, which is not limited here.

In some examples of the present disclosure, as shown in FIG. 6 and FIG. 7, pixel units SP_2 are arranged at the edges, close to the signal transmission part A6, of the signal transmission parts A2 to A5; and pixel units SP_1 are arranged in the rest areas of the signal transmission parts A2 to A5. In this way, the image may be clearer.

In some examples of the present disclosure, as shown in FIG. 6 and FIG. 7, pixel units SP_2 are arranged at the edges of signal transmission parts A1 to A5, and pixel units SP_1 are arranged in the rest areas of the signal transmission parts A1 to A5. In this way, the image may be clearer.

In some examples of the present disclosure, as shown in FIG. 6, the transparent display panel 10 may further include: a plurality of first connection pads 510_1 to 510_5, second connection pads, a plurality of signal transmission lines 610_1 to 610_5 and a common voltage transmission line 620; the plurality of first connection pads 510_1 to 510_5 and the plurality of signal transmission lines 610_1 to 610_5 are arranged in the same layer as the signal transmission layer 110; the common voltage transmission line 620 and the signal transmission layer 110 are arranged in the same layer and insulated from each other; and the second connection pads are arranged in the same layer as the signal transmission layer 110. For the signal transmission part corresponding to the electrode switching parts electrically connected with the signal transmission layer 110, the signal transmission part is electrically connected with at least one of the plurality of first connection pads through at least one of the plurality of signal transmission lines. Exemplarily, one signal transmission line may be electrically connected with the plurality of first connection pads. For the signal transmission part corresponding to the electrode switching parts electrically connected with the signal transmission layer 110, the signal transmission part may be electrically connected with the plurality of first connection pads through one signal transmission line. The common voltage transmission line 620 is electrically connected with the second electrode layer 170 through a wiring through-hole penetrating through the insulating layer. Thus, a voltage may be transmitted to the second electrode layer 170 through the common voltage transmission line 620. A first end of the common voltage transmission line 620 is electrically connected with at least one second connection pad, and a second end of the common voltage transmission line 620 is electrically connected with at least one second connection pad. Exemplarily, the second connection pads have a plurality of second connection pads 520_1 and a plurality of second connection pads 520_2. The plurality of second connection pads 520_1 are arranged on one side of all the first connection pads 510_1 to 510_5, and the plurality of second connection pads 520_2 are arranged on the other side of all the first connection pads 510_1 to 510_5. The first end of the common voltage transmission line 620 is electrically connected with the plurality of second connection pads 520_1, and the second end of the common voltage transmission line 620 is electrically connected with the plurality of second connection pads 520_2.

In some examples of the present disclosure, dummy pads are further arranged between the first connection pads connected by different signal transmission lines to isolate the first connection pads input with different voltages.

In some examples of the present disclosure, a dummy bonding pad is also arranged on a side, facing away from the first connection pads, of the second connection pads to protect the second connection pads.

In some examples of the present disclosure, as shown in conjunction with FIG. 6 to FIG. 8, different signal transmission parts may transmit different voltages, and then the signal transmission lines electrically connected with different signal transmission parts transmit different voltages.

Exemplarily, as shown in FIG. 6 to FIG. 8, for example, the signal transmission layer 110 is divided into six signal transmission parts A1 to A6, the signal transmission part A1 is electrically connected with four first connection pads 510_1 through one signal transmission line 610_1, the signal transmission part A2 is electrically connected with four first connection pads 510_2 through one signal transmission line 610_2, the signal transmission part A3 is electrically connected with four first connection pads 510_3 through one signal transmission line 610_3, the signal transmission part A4 is electrically connected with four first connection pads 510_4 through one signal transmission line 610_4, the signal transmission part A5 is electrically connected with four first connection pads 510_5 through one signal transmission line 610_5, and the signal transmission part A6 does not connect the signal transmission line and the first connection pad. Furthermore, the first connection pads 510_1 may transmit a first voltage VDD1, the first connection pads 510_2 may transmit a first voltage VDD2, the first connection pads 510_3 may transmit a first voltage VDD3, the first connection pads 510_4 may transmit a first voltage VDD4, the first connection pads 510_5 may transmit a first voltage VDD5, and the second connection pads 520_1 and 520_2 may transmit a second voltage VSS.

Exemplarily, the driving circuit 20 may be electrically connected with the first connection pads 510_1 to 510_5 and the second connection pads 520_1 and 520_2 in a bonding manner. Alternatively, the driving circuit 20 may be electrically connected with a printed circuit board (PCB) in a bonding manner, and then the flexible printed circuit (FPC) is electrically connected with the first connection pads 510_1 to 510_5 and the second connection pads 520_1 and 520_2 in a bonding manner.

Exemplarily, the driving circuit 20 may be connected with a power supply voltage (such as, 5V), and after the power supply voltage is converted, the second voltage VSS and the first voltages VDD1~VDD5 may be converted, where the first voltages VDD1~VDD5 may be respectively input to the first connection pads 510_1~ 510_5, the second voltage VSS is respectively input to the second connection pads 520_1 and 520_2, thereby driving the electroluminescent diodes connected with the signal transmission parts A1 to A5 to emit light and display patterns. However, the electroluminescent diode in the signal transmission part A6 is not connected with the signal transmission part, so an area where the signal transmission part A6 is located does not emit light and is transparent, thereby realizing the display function.

Figure 9:
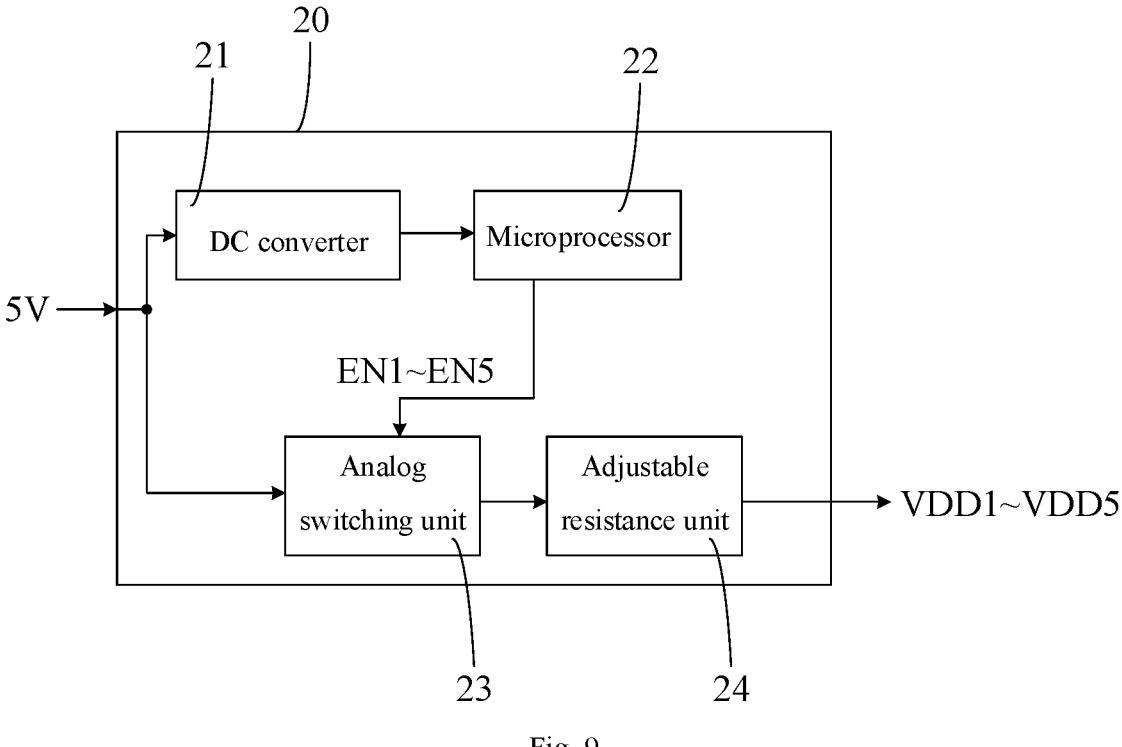
FIG. 9 is a schematic structural diagram of a driving circuit provided by an embodiment of the present disclosure.

Exemplarily, as shown in FIG. 9, the driving circuit 20 may include a direct current (DC) converter 21, a microprocessor 22, an analog switching unit 23 and an adjustable resistance unit 24. Where a power supply voltage (such as 5V) is input, the power supply voltage (such as 5V) is input to the DC converter 21 to step down and output a power supply voltage (such as 3.3V), and the power supply voltage is input to the microprocessor 22 to supply power to the microprocessor 22. The microprocessor 22 may control the output of enable signals EN1 to EN5 which are in one to one correspondence with different first voltages VDD1~VDD5. The power supply voltage (such as, 5V) is further input to the analog switching unit 23 to supply power to the analog switching unit 23. The analog switching unit 23 receives the enable signals EN1 to EN5, and outputs the first analog voltages VM1 to VM5 which are in one to one correspondence with the first voltages VDD1~VDD5 under the control of the enable signals EN1 to EN5. The first analog voltages VM1 to VM5 are input to the adjustable resistance unit 24; and by increasing or decreasing the adjustable resistance in the adjustable resistance unit 24, the first analog voltages VM1 to VM5 may be increased or decreased to output the adjusted first voltages VDD1~VDD5.

It should be noted that the enable signals EN1 to EN5 are controlled by the microprocessor 22, and a lighting combination of any state, such as lighting of different signal transmission parts at the same time or one by one may be completed by pre-recording. If the voltage required by the driving circuit 20 is higher than 5V and lower than 12V of the power supply voltage, it can be realized by adding a boost chip or by adding a buck chip to an external 12V power supply, which will not be repeated here.

Embodiments of the present disclosure further provide a display apparatus, including the transparent display panel provided by the embodiments of the present disclosure. The principle of solving the problem of the display apparatus is similar to that of the transparent display panel, so the implementation of the display apparatus may refer to the implementation of the transparent display panel, and the repetition is omitted here.

During specific implementation, in the embodiments of the present disclosure, the display apparatus may be: a mobile phone, a tablet computer, a television, a monitor, a notebook computer, a digital photo frame, a navigator and other products or components with display functions. Other essential components of the display apparatus should be understood by those skilled in the art, and will not be repeated here, nor should they be taken as limitations of the present disclosure.

Although the preferred embodiments of the present disclosure have been described, those skilled in the art can make additional changes and modifications to these embodiments once they know the basic inventive concepts. Therefore, the appended claims are intended to be interpreted as including the preferred embodiment and all changes and modifications that fall within the scope of the present disclosure.

Obviously, those skilled in the art can make various modifications and variations to the embodiments of the present disclosure without departing from the spirit and scope of the embodiments of the present disclosure. Thus, if these modifications and variations of the embodiments of the present disclosure are within the scope of the claims of the present disclosure and their equivalents, the present disclosure is also intended to include these modifications and variations.

What is claimed is:

1. A transparent display panel, comprising:

a substrate;

a signal transmission layer, disposed on the substrate, and having a plurality of hollowed-out areas; and a first electrode layer, disposed on the substrate, and having a plurality of first electrodes arranged at intervals;

wherein an orthogonal projection of at least one of the plurality of first electrodes on the substrate and an orthogonal projection of at least one of the plurality of hollowed-out areas on the substrate have an overlapping area;

wherein each of the plurality of first electrodes comprises an electrode switching part and an electrode main body part which are electrically connected with each other;

an orthogonal projection of each of the plurality of hollowed-out areas on the substrate and an orthogonal projection of an electrode main body part of the at least one first electrode on the substrate have an overlapping area; and orthogonal projections of electrode switching parts on the substrate and an orthogonal projection of the signal transmission layer on the substrate have overlapping areas;

orthogonal projections of edges of electrode main body parts on the substrate and the orthogonal projection of the signal transmission layer on the substrate have overlapping areas; and orthogonal projections of part of the electrode main body parts except the edges on the substrate are in orthogonal projections of the plurality of hollowed-out areas on the substrate.

2. The transparent display panel according to claim 1, wherein the transparent display panel further comprises an insulating layer disposed between the signal transmission layer and the first electrode layer; and an electrode switching part of the at least one first electrode is electrically connected with the signal transmission layer through at least one electrode through-hole; wherein the at least one electrode through-hole penetrates through the insulating layer.

3. The transparent display panel according to claim 2, wherein electrode switching parts of part of the plurality of first electrodes are electrically connected with the signal transmission layer through the electrode through-holes, and electrode switching parts of a remaining part of the plurality of first electrodes are in a floating state.

4. The transparent display panel according to claim 3, wherein the electrode switching parts electrically connected with electrode main body parts of which orthogonal projections overlap orthogonal projections of part of the plurality of hollowed-out areas are electrically connected with the signal transmission layer through the electrode through-holes; and the electrode switching parts electrically connected with electrode main body parts of which orthogonal projections overlap orthogonal projections of a remaining part of the plurality of hollowed-out areas are in a floating state.

5. The transparent display panel according to claim 4, wherein the insulating layer comprises an interlayer insulating layer and a planarization layer; wherein the interlayer insulating layer is disposed between the signal transmission layer and the first electrode layer, and the planarization layer is disposed between the interlayer insulating layer and the first electrode layer;

a same electrode through-hole comprises a first electrode through-hole and a second electrode through-hole; wherein the first electrode through-hole penetrates through the interlayer insulating layer, and the second electrode through-hole penetrates through the planarization layer; and an orthogonal projection of the second electrode through-hole on the substrate covers an orthogonal projection of the first electrode through-hole on the substrate.

6. The transparent display panel according to claim 2, wherein the electrode through-holes corresponding to electrode main body parts of which orthogonal projections overlap an orthogonal projection of a same hollowed-out area are disposed at a same side of the hollowed-out area.

7. The transparent display panel according to claim 6, wherein the electrode through-holes corresponding to the electrode main body parts covered by the orthogonal projections of at least part of hollowed-out areas are disposed at the same side of the at least part of hollowed-out areas.

8. The transparent display panel according to claim 2, wherein the transparent display panel comprises a plurality of pixel units; at least one of the plurality of pixel units comprises at least one sub-pixel; and the at least one sub-pixel comprises the at least one first electrode.

9. The transparent display panel according to claim 8, wherein electrode main body parts of which orthogonal projections overlap the orthogonal projection of a same hollowed-out area are disposed in a same pixel unit; and electrode main body parts of which orthogonal projections overlap the orthogonal projections of different hollowed-out areas are disposed in different pixel units.

10. The transparent display panel according to claim 9, wherein each of the plurality of pixel units comprises a first sub-pixel, a second sub-pixel and a third sub-pixel; and a size of an electrode main body part in the first sub-pixel is larger than a size of an electrode main body part in the second sub-pixel, and the size of the electrode main body part in the second sub-pixel is larger than a size of an electrode main body part in the third sub-pixel.

11. The transparent display panel according to claim 10, wherein, in the same pixel unit, the electrode main body part in the second sub-pixel and the electrode main body part in the third sub-pixel are arranged in a first direction and form a main body part group; and in the same pixel unit, the electrode main body part in the first sub-pixel and the main body part group are arranged in a second direction.

12. The transparent display panel according to claim 11, wherein each electrode switching part comprises an electrode extension part and a through-hole connection part;

in a same first electrode, the electrode main body part is electrically connected with the through-hole connection part through the electrode extension part;

through-hole connection parts of part of the plurality of first electrodes are electrically connected with the signal transmission layer through the electrode through-holes, and through-hole connection parts of a remaining part of the plurality of first electrodes are in a floating state; and the through-hole connection parts of the plurality of first electrodes are disposed at a same side of the plurality of first electrodes.

13. The transparent display panel according to claim 12, wherein, in the same pixel unit, the electrode extension part in the third sub-pixel is disposed between the electrode extension part in the first sub-pixel and the electrode extension part in the second sub-pixel.

14. The transparent display panel according to claim 13, wherein, in the same pixel unit, the electrode main body part in the third sub-pixel is disposed on a side, facing away from the through-hole connection part in the second sub-pixel, of the electrode main body part in the second sub-pixel;

the electrode main body part in the second sub-pixel is disposed between the electrode main body part in the third sub-pixel and the through-hole connection part in the second sub-pixel; and in the same pixel unit, the electrode extension part in the third sub-pixel extends and is arranged in a gap between the electrode main body part in the first sub-pixel and the electrode main body part in the second sub-pixel.

15. The transparent display panel according to claim 10, wherein the transparent display panel further comprises a pixel defining layer disposed on a side, facing away from the substrate, of the first electrode layer;

the pixel defining layer has openings; wherein the plurality of first electrodes are arranged corresponding to the openings; and orthogonal projections of the electrode main body parts of the plurality of first electrodes on the substrate cover orthogonal projections of the corresponding openings on the substrate.

16. The transparent display panel according to claim 1, wherein at least one mesh connection of the signal transmission layer has a perforative digging hole.

17. The transparent display panel according to claim 1, wherein the signal transmission layer is divided into a plurality of signal transmission parts which are insulated from each other, and each of the plurality of signal transmission parts has the at least one hollowed-out area; and electrode switching parts corresponding to at least part of the plurality of hollowed-out areas in at least one signal transmission part are electrically connected with the signal transmission layer through electrode through-holes.

18. A display apparatus, comprising a driving circuit and the transparent display panel according to claim 1;

wherein the driving circuit is electrically connected with the transparent display panel; and the driving circuit is configured to drive the transparent display panel to display a pattern.

\* \* \* \* \*